(12) United States Patent
Schmauss et al.

(10) Patent No.: US 9,435,857 B2
(45) Date of Patent: Sep. 6, 2016

(54) INTEGRATED CIRCUIT FOR SWITCHING LOADS, CIRCUIT ARRANGEMENT COMPRISING AN INTEGRATED CIRCUIT AND A CONNECTED LOAD, AND METHOD FOR OPERATING SUCH A CIRCUIT ARRANGEMENT

(71) Applicant: CONTINENTAL AUTOMOTIVE GMBH, Hannover (DE)

(72) Inventors: Harald Schmauss, Donaustauf (DE);
Sergiu Muresan, Cluj-Napoca (RO);
Gunther Wolfarth, Regensburg-Harting (DE); Marco Well, Giessen (DE);
Johann Falter, Wenzenbach (DE);
Franz Laberer, Regensburg (DE);
Cristian Theil, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 2 days.

(21) Appl. No.: 14/359,205

(22) PCT Filed: Nov. 15, 2012

(86) PCT No.: PCT/EP2012/072718
§ 371 (c)(1),
(2) Date: May 19, 2014

(87) PCT Pub. No.: WO2013/072411
PCT Pub. Date: May 23, 2013

(65) Prior Publication Data
US 2014/0320160 A1  Oct. 30, 2014

(30) Foreign Application Priority Data

Nov. 18, 2011  (DE) .................. 10 2011 086 626

(51) Int. Cl.
*G01R 31/28* (2006.01)
*G01R 31/327* (2006.01)

(52) U.S. Cl.
CPC ....... *G01R 31/2889* (2013.01); *G01R 31/3277* (2013.01)

(58) Field of Classification Search
USPC ....... 324/762.03, 750.3, 415, 418, 503, 538, 324/750.02, 756.02, 76.11; 257/48; 323/271
See application file for complete search history.

(56) References Cited

U.S. PATENT DOCUMENTS 5,672,917 A * 9/1997 Nakano ............. G01R 31/3277
307/116

(Continued)

FOREIGN PATENT DOCUMENTS

| DE | 10025908 A1 | 8/2001 |
|---|---|---|
| DE | 102004054374 B3 | 5/2006 |
| DE | 102006045308 A1 | 3/2008 |

*Primary Examiner* — Melissa Koval
*Assistant Examiner* — Nasima Monsur
(74) *Attorney, Agent, or Firm* — Laurence A. Greenberg; Werner H. Stemer; Ralph E. Locher

(57) ABSTRACT

An integrated circuit has a controllable switching element, the load path of which is arranged between an output of the integrated circuit and a supply potential. A test unit is connected to the connections of the switching element in order to carry out tests. A control unit is connected to the test unit via at least one control line. The sequence of tests is carried out dependent on signals on the control line(s). A memory is connected to the control unit the content and the type of which determines the time of the tests. The memory is connected to an input of the integrated circuit in order to enter the content.

10 Claims, 1 Drawing Sheet

(56) References Cited

U.S. PATENT DOCUMENTS

| | | |
|---|---|---|
| 5,875,087 A | 2/1999 | Spencer et al. |
| 7,265,535 B2 | 9/2007 | Arndt et al. |
| 8,416,546 B2 | 4/2013 | Arndt et al. |
| 2002/0093360 A1* | 7/2002 | Nagata ............... G01R 31/2884 361/86 |
| 2003/0054229 A1* | 3/2003 | Odaohhara ........ G01R 31/3648 429/61 |
| 2003/0169550 A1 | 9/2003 | Burk |
| 2006/0273820 A1* | 12/2006 | Arnold ........... G01R 31/318572 326/16 |
| 2010/0134091 A1 | 6/2010 | Eom et al. |
| 2011/0058296 A1* | 3/2011 | Orchowski .......... H05B 39/044 361/88 |

* cited by examiner

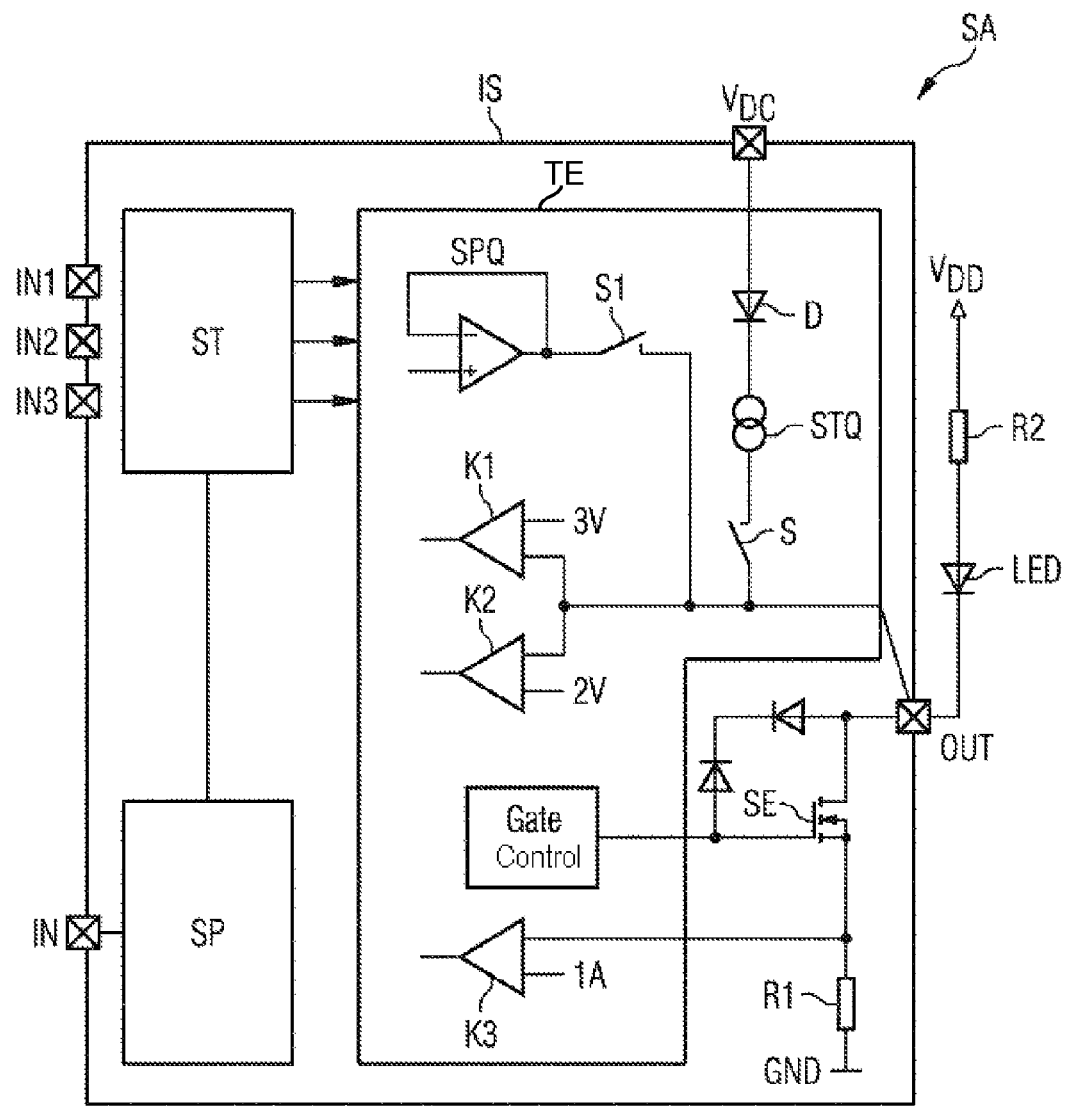

INTEGRATED CIRCUIT FOR SWITCHING LOADS, CIRCUIT ARRANGEMENT COMPRISING AN INTEGRATED CIRCUIT AND A CONNECTED LOAD, AND METHOD FOR OPERATING SUCH A CIRCUIT ARRANGEMENT

BACKGROUND OF THE INVENTION

Field of the Invention

Loads need to be switched on or off in most electrical or electronic devices. In addition to relays or other mechanical switches, electronic power transistors, usually in integrated form, are often used as switches. In particular in vehicles there is a plethora of loads which need to be switched on and off frequently, often even several times per second. Examples of such loads are solenoids for injection valves, heavy-duty relays, motors and many types of signaling luminaires in the form of lamps or light-emitting diodes.

DE 10 2006 045 308 A1 describes a circuit arrangement comprising an integrated circuit which contains a switching element, by means of which a load which is connectable to the integrated circuit can be switched on and off. The switching elements integrated in integrated circuits are often in the form of so-called low-side switches, in the case of which a switching connection can be switched to a predetermined low potential, usually by means of a power transistor. This is used for actuating a load connected to the switching connection, for example a switching relay, which needs to switch particularly high currents or voltages. Such a low-side switch connects a load which is at an operating voltage potential to ground. In the case of high-side switches, the respective switching connection of a load can be connected to a predetermined high potential via a switching transistor in order to supply energy to the respective load, which is at ground potential. In principle, it is also possible to connect both a high-side switch and a low-side switch to an output in the integrated circuit so that a load connected thereto can be connected both to the positive supply potential and to ground, depending on which transistor is being actuated. In addition, by corresponding selection and combination of a plurality of outputs of such an integrated circuit, H bridges can also be formed, for example, in order to actuate a motor, as load.

In addition to the supply of energy to a load by virtue of the actuation of the switching connection of the respective switching element, it is also desirable to identify possible fault states of the switching element, the load itself or the lines. Conventional faults are in this case short circuits of connections of the switching element or of the load with respect to ground and of the positive supply voltage or an interruption in the line, for example between the switching element and the load. In order to identify these possible faults, methods are known in which, in the disconnected state of the respective switching element, a reference potential is applied to a respective connection, and the voltage-time profile is measured. However, even in the switched-on state of the switching element, it is possible to conclude that there are short circuits or else an interruption in the line on the basis of voltage potentials, but also on the basis of voltage profiles and on the ratios of different voltages and currents with respect to one another.

DE 10 2004 054 374 B3 describes a diagnosis concept for testing integrated circuits using power transistors. In this case, a plurality of switching elements in the form of power transistors are usually provided in an integrated circuit, both as low-side switches or high-side switches or else as bridge circuits with respective outputs of the integrated circuit for connecting a load.

An integrated circuit comprising switching elements is usually actuable by a microprocessor via a standardized bus, for example an SPI bus. Firstly, the switching commands can be communicated via this interface and secondly also the test results can be indicated to the microprocessor. It is desirable if the tests in the integrated circuit are performed autonomously and only the results are transmitted to the microprocessor, for example, for further processing.

BRIEF SUMMARY OF THE INVENTION

In particular in the case of light-emitting diodes as the load to be connected, a test in the actually switched-off state can result in a current flow through the light-emitting diode which results at least in illumination for a short period of time, which can be irritating for a driver in the case of application in a dashboard of a vehicle, for example.

The object of the invention therefore consists in avoiding this problem.

The object is achieved by an integrated circuit as claimed, a circuit arrangement as claimed and a method as claimed. Advantageous developments are specified in the dependent claims.

In accordance with the invention, an integrated circuit comprising a controllable switching element has a test unit, by means of which the various tests for the functionality of the switching element and the integrity of the lines can be performed. In particular, short circuits to ground and supply potential and line breakages are detectable. A control unit in this case actuates the test unit in order to determine the type and time and sequence of the tests. In accordance with the invention, a memory which can be written to via an input of the integrated circuit is provided, it being possible for the content of said memory to be called up by the control unit and for said memory to be used to determine the type and time of respective tests.

Thus, for example, it is possible to determine via corresponding information that, in the case of a light-emitting diode connected to the output of the integrated circuit as load to be switched by means of the switching element, no line breakage detection tests are implemented during normal operation since these tests connect a test current to the line when the switching element is switched off in order to call up a voltage expected in the case of an intact line, which current can, however, result in an at least weak, but disruptive illumination of the light-emitting diode.

By virtue of the invention, therefore, it is possible in a simple manner, by writing corresponding information to the memory, to determine that a light-emitting diode is connected to the output and which tests should therefore be performed at what times. This can be determined specifically and variably by the selection of the information for the memory for each load to be connected.

BRIEF DESCRIPTION OF THE DRAWING

The invention will be explained in more detail below with reference to an exemplary embodiment with the aid of a FIGURE, in which:

The FIGURE shows a circuit arrangement according to the invention.

A circuit arrangement SA according to the invention as shown in the FIGURE is formed by an integrated circuit IS, with a light-emitting diode LED connected to the output OUT of said integrated circuit via a second resistor R2 with a positive supply potential $V_{DD}$. In the FIGURE, only one output OUT is illustrated, but in principle the integrated circuit IS can be formed with a multiplicity of further outputs.

DESCRIPTION OF THE INVENTION

The output OUT is connected to the ground potential GND within the integrated circuit IS via the switching path of a switching element SE and a first resistor R1. The switching element SE is therefore in the form of a so-called low-side switch; however, switching elements in the form of high-side switches, which therefore connect the respective output to the positive supply potential via the load path of said switches, can likewise be formed at the further outputs. In the same way, it is possible to connect both a high-side switch and a low-side switch to the same output.

The switching element SE is in the form of an n-channel MOSFET, in which, in order to clamp the voltage produced at the drain connection during disconnection, the drain and gate connections are connected to one another via a diode which is polarized in the forward direction and a diode which is polarized in the reverse direction. The gate connection of the switching element SE is connected to a gate actuation circuit GateControl.

The integrated circuit has, in addition to the switching element SE, also a test unit TE, in which a multiplicity of voltage and/or current sources, voltage and/or current measuring devices can be formed. A voltage source SPQ, which is in the form of a voltage buffer and provides a current of a specific magnitude, for example in the µA range, is illustrated by way of example. This voltage source SPQ can be connected to the output connection OUT via a first switch S1.

In addition, a window comparator which is formed by two comparators K1 and K2 is illustrated. Two voltages with the values 2V and 3V are specified as window limits. It is possible to determine by means of the voltage source SPQ and the window comparator K1, K2, for example, whether a setpoint voltage of between 2 and 3 V can be measured when the voltage of the voltage source SPQ is applied via the switch S1 to the output connection OUT. If this is not the case, it can be concluded that there is a fault, depending on which of the setpoint thresholds has been undershot or exceeded.

The test unit TE should also have a third comparator K3, by way of example, one input of said comparator being connected to the connecting connection between the switching element SE and the first resistor R1 in order to be able to determine the current through the switching element SE by means of the voltage drop across the first resistor R1. For test purposes, the switching element SE can be switched on or off via a subcircuit GateControl of the test unit TE. The test unit TE also contains a diode D, a current source STQ and a second switch S2, connected in series between a connection for the first supply potential $V_{DD}$ and the output OUT. As a result, a test current can be applied to the lines connected to the output OUT of the integrated circuit IS. By virtue of corresponding evaluation of the measured voltages and currents, it is possible to determine, by means of the test circuits illustrated within the test unit TE, whether a short circuit to ground or the supply potential of the drain or source connection of the switching element SE in the form of a MOSFET or a line interruption is present at the output OUT, for example.

The actuation of the test unit TE takes place via a controller, which for its part can be actuated by an external microprocessor via an interface (not illustrated). It is possible to determine by means of the control unit ST the sequence in which and at what times which voltages and which currents can be applied to the connections of the switching element SE and in what way these are evaluated. If, for example, when the switching element SE is switched off, a voltage is applied to the output OUT via the voltage source SPQ, in the case of an intact line a current would flow from the first supply potential $V_{DD}$ through the light-emitting diode LED, which could result in an at least weak illumination of the light-emitting diode LED, despite the element SE being switched off. In certain applications, this may be destructive, in particular in the case of a dashboard of a motor vehicle, since a driver could be irritated by this.

According to the invention, therefore, a memory SP is provided in the integrated circuit, which memory is connected to the control unit ST and to which memory information coming from a microprocessor, for example, can be written via an input IN of the integrated circuit IS. This information contains which type of load, for example a light-emitting diode LED, is connected to the output OUT of the integrated circuit IS and which tests are intended to be performed correspondingly in what sequence or at what times. Thus, owing to the problems described for a connected light-emitting diode LED, it is possible and expedient to instruct, on the basis of the information written to the memory SP, the control unit ST to actuate the test unit TE in such a way that a line breakage test is only implemented when an illumination of the light-emitting diode LED is not disruptive, i.e. for example, when a vehicle is started, i.e. when all of the warning lights on the vehicle illuminate owing to a test operating mode. All other tests can be performed as standard.

The information in the memory SP can either be permanently written or else can be rewritten by the microprocessor each time operation is started. In this way, it is possible to implement modifications, in particular to configure variably the use of the output(s) for various loads.

The integrated circuit IS furthermore has a number of further inputs IN1 to INn, via which, for example, the control unit ST can be actuated externally or else the control connection of the switching element SE, in the illustrated example the gate connection of the n-channel MOSFET, can be correspondingly actuated externally, for example by the microprocessor, in order to operate the load.

The invention claimed is:

1. An integrated circuit having an input and an output, the integrated circuit comprising: a controllable switching element having load path connected between the output of the integrated circuit and a supply potential; a test unit connected to said switching element for performing tests; a control unit connected to said test unit via at least one control line, wherein the tests are performed depending on signals on said at least one control line; and a memory connected to said control unit and containing non-transitory information for determining a nature and a time of the tests, said memory being connected to the input of the integrated circuit for receiving the information; wherein the information, which is for determining the nature and the time of the tests, and which is in said memory, is dependent on a type of load to be connected to the output of the integrated circuit.

2. The integrated circuit according to claim 1, wherein the supply potential is a ground potential.

3. A circuit arrangement, comprising an integrated circuit according to claim 1 and a load connected to the output of the integrated circuit.

4. The circuit arrangement according to claim 3, wherein said load is a light-emitting diode.

5. A method, which comprises: providing a circuit arrangement including an integrated circuit having: a controllable switching element having load path connected between the output of the integrated circuit and a supply potential, a test unit connected to the switching element for performing tests, a control unit connected to the test unit via at least one control line, wherein the tests are performed depending on signals on the at least one control line, and a memory connected to the control unit and containing non-transitory information for determining a nature and a time of the tests, the memory being connected to the input of the integrated circuit for receiving the information; providing the circuit arrangement with a load connected to the output of the integrated circuit, wherein the information, which is for determining the nature and the time of the tests, and which is in the memory, is dependent on a type of the load connected to the output of the integrated circuit; inputting information relating to a type of load via the input of the integrated circuit into the memory; reading the information in the memory with the control unit and actuating the test unit with the control unit depending on the information; and testing the switching element with the test unit, wherein a type and a time of a test is determined by the control unit based on the information in the memory.

6. The method according to claim 5, which comprises inputting the information into the memory each time the integrated circuit is switched on.

7. The method according to claim 6, which comprises inputting the information with a microprocessor.

8. The method according to claim 5, which comprises determining with the information that a line breakage test be performed with a light-emitting diode forming the load, only during times at which a resultant illumination of the light-emitting diode is not critical.

9. The method according to claim 5, wherein the information in said memory includes information specifying performing at least one of the tests during a time when a vehicle is started.

10. The integrated circuit according to claim 1, wherein the information in said memory includes information specifying performing at least one of the tests during a time when a vehicle is started.

* * * * *